United States Patent
Li et al.

(10) Patent No.: US 12,237,446 B2
(45) Date of Patent: Feb. 25, 2025

(54) WAVELENGTH CONVERSION APPARATUS AND METHOD FOR MANUFACTURING THE SAME

(71) Applicant: YLX Incorporated, Shenzhen (CN)

(72) Inventors: Qian Li, Shenzhen (CN); Zifeng Tian, Shenzhen (CN)

(73) Assignee: YLX Incorporated, Shenzhen (CN)

( * ) Notice: Subject to any disclaimer, the term of this patent is extended or adjusted under 35 U.S.C. 154(b) by 0 days.

(21) Appl. No.: 18/022,073

(22) PCT Filed: Jul. 13, 2021

(86) PCT No.: PCT/CN2021/105907
§ 371 (c)(1),
(2) Date: Feb. 17, 2023

(87) PCT Pub. No.: WO2022/037317
PCT Pub. Date: Feb. 24, 2022

(65) Prior Publication Data
US 2023/0369544 A1    Nov. 16, 2023

(30) Foreign Application Priority Data
Aug. 17, 2020   (CN) .......................... 202010825666.6

(51) Int. Cl.
*H01L 33/50*   (2010.01)
*H01L 33/46*   (2010.01)
*H01L 33/64*   (2010.01)

(52) U.S. Cl.
CPC ............ *H01L 33/502* (2013.01); *H01L 33/46* (2013.01); *H01L 33/641* (2013.01); *H01L 2933/0041* (2013.01)

(58) Field of Classification Search
CPC .......... F21V 9/30; F21V 13/08; F21V 29/505; F21V 29/70; F21V 7/22; C03C 8/14;
(Continued)

(56) References Cited

U.S. PATENT DOCUMENTS

| 3,348,056 A | 10/1967 | Kohashi |
| 2016/0077415 A1* | 3/2016 | Motoya .............. G03B 21/204 427/157 |

FOREIGN PATENT DOCUMENTS

| CN | 107221373 | 9/2017 |
| CN | 107221373 B | 10/2018 |

(Continued)

OTHER PUBLICATIONS

International Search Report issued in corresponding International Application PCT/CN2021/105907, mailed Sep. 29, 2021.
(Continued)

*Primary Examiner* — Elmito Breval
(74) *Attorney, Agent, or Firm* — Burris Law, PLLC (57) ABSTRACT

The present disclosure relates to a wavelength conversion apparatus and a manufacturing method therefor. The wavelength conversion apparatus comprises a light-emitting layer, a reflective film, a sintering silver layer, and a substrate stacked successively. The light-emitting layer converts an excitation light into exit light having a different wavelength from the excitation light. The reflective film is plated on the light-emitting layer and used for reflecting the exit light emitted by the light-emitting layer. The sintering silver layer is connected to the light-emitting layer and the substrate; the sintering silver layer comprises flake silver particles connected with each other via surface contact; and the sintering silver layer is formed by sintering spherical silver nanoparticles and flake silver particles. The wavelength conversion apparatus is characterized by excellent thermal conductivity and high luminous efficiency.

20 Claims, 1 Drawing Sheet

(58) Field of Classification Search
CPC .............. C04B 41/009; C04B 41/5022; C04B 41/5032; C04B 41/89; C09K 11/02; C09K 11/08; G02B 5/0242; G02B 5/0284; G02B 5/0808; G02B 7/181
See application file for complete search history.

(56) References Cited

FOREIGN PATENT DOCUMENTS

| | | | |
|---|---|---|---|
| CN | 108930919 | 12/2018 | |
| CN | 109681846 | 4/2019 | |
| CN | 109773211 | 5/2019 | |
| CN | 109887638 | 6/2019 | |
| CN | 108954039 B | 7/2020 | |
| WO | WO-2018209819 A1 * | 11/2018 | .............. F21K 9/64 |
| WO | 2019075939 A1 | 4/2019 | |

OTHER PUBLICATIONS

European Search Report issued in corresponding EP Application 21857412.7, issued Aug. 28, 2024, 9 pages.

* cited by examiner

WAVELENGTH CONVERSION APPARATUS AND METHOD FOR MANUFACTURING THE SAME

CROSS-REFERENCE TO RELATED APPLICATIONS

This application is a National Phase of International Application No. PCT/CN2021/105907, filed on Jul. 13, 2021, which claims priority to and the benefit of Chinese Patent Application No. 202010825666.6, filed on Aug. 17, 2020. The disclosures of the above applications are incorporated herein by reference.

FIELD

The present disclosure relates to the technical field of lighting and projection, and in particular, to a wavelength conversion apparatus, a method for manufacturing the wavelength conversion apparatus, and a light-emitting apparatus using the wavelength conversion apparatus.

BACKGROUND

The statements in this section merely provide background information related to the present disclosure and may not constitute prior art.

With the development of display and lighting technologies, original LEDs or halogen bulbs as light sources are increasingly unable to meet high power and high brightness requirements of display and lighting. Visible light in various colors can be obtained by using a method of using a solid-state light source such as a laser diode (LD) to excite a wavelength conversion material. The technology is increasingly used in lighting and display. The technology has advantages of high efficiency, low energy consumption, low costs, and a long service life, which is an ideal alternative to existing white or monochromatic light sources.

In the related art, when the wavelength conversion apparatus is irradiated and excited by a laser light source, continuous laser irradiation leads to a harsh operating environment of the wavelength conversion apparatus. In order to withstand the continuous laser irradiation and prevent the problem of thermal quenching caused by a rapid increase in a temperature due to impossible discharge of a large amount of heat generated by a light-emitting layer during wavelength conversion, a main material of the light-emitting layer has been developed from conventional organic materials to inorganic materials with better heat conduction and heat resistance, such as glass and ceramics.

For overall thermal conductivity and luminous efficiency of the wavelength conversion apparatus, whether a heat conduction channel from the light-emitting layer to a substrate is smooth is also a key factor. At present, the light-emitting layer and the substrate are connected generally by a soldering layer or a sintering silver layer. The sintering silver layer has better thermal conductivity than the soldering layer, but also has some problems as follows.

In a process of sintering an organic silver paste to form the sintering silver layer, especially in large-size packaging of more than 4*4 mm$^2$, it is difficult to volatilize an organic solvent in a middle region of the organic silver paste, and spherical silver nanoparticles easily cause an excessively large shrinkage size and relatively large stress during the sintering, which leads to problems such as reduced adhesion force and easy detachment of the sintering silver layer. At the same time, during the sintering, more pores are formed, which reduces a contact area between the spherical silver nanoparticles and reduces thermal conductivity.

Therefore, there is a need to develop a wavelength conversion apparatus with good overall reliability and excellent thermal conductivity and heat dissipation performance.

SUMMARY

This section provides a general summary of the disclosure and is not a comprehensive disclosure of its full scope or all of its features.

With respect to the above defects existing in the related art, the present disclosure provides a wavelength conversion apparatus with high overall device reliability, good thermal conductivity and heat dissipation performance, and high luminous efficiency and a method for manufacturing the wavelength conversion apparatus. The wavelength conversion apparatus can be applied to continuous irradiation of high-power laser.

The present disclosure provides a wavelength conversion apparatus, including a light-emitting layer, a reflective film, a sintering silver layer, and a substrate stacked successively; wherein the light-emitting layer converts an excitation light into an exit light having a different wavelength from the excitation light, and the reflective film is plated on the light-emitting layer and used for reflecting the exit light emitted by the light-emitting layer; and the sintering silver layer is connected to the light-emitting layer and the substrate, and the sintering silver layer includes flake silver particles connected with each other via surface contact.

In the technical solution of the present disclosure, by mixing and sintering spherical silver nanoparticles and flake silver particles, the spherical silver nanoparticles melt and bind the flake silver particles together to form the sintering silver layer. Large-size flake silver particles in the sintering silver layer ameliorate the shrinkage of the sintered silver paste, reduce sintering stress, and improve adhesive properties of the sintering silver layer. At the same time, the large-size flake silver particles in the sintering silver layer are connected with each other via surface contact, and the large-size flake silver particles as heat conduction channels and surface contact heat transfer therebetween can improve the thermal conductivity of the sintering silver layer.

In some embodiments, thermal conductivity of the sintering silver layer ranges from 80 W/(m·k) to 250 W/(m·k).

In some embodiments, a content of the flake silver particles in the sintering silver layer ranges from 2 wt % to 20 wt %, which ranges, for example, from 5 wt % to 15 wt % or from 7 wt % to 10 wt %.

In some embodiments, the light-emitting layer is a light-emitting ceramic layer. The light-emitting layer made of a ceramic material is characterized by excellent heat resistance and thermal conductivity.

In some embodiments, the reflective film is a silver reflective film. The silver reflective film is characterized by compactness and high reflectivity.

In some embodiments, a transition layer is arranged between the light-emitting ceramic layer and the silver reflective film. The transition layer enhances bonding force between the light-emitting ceramic layer and the silver reflective film. The transition layer may be an $Al_2O_3$ layer or a $SiO_2$ layer. In addition, an alternating film layer of a high refractive index dielectric film and a low refractive index dielectric film, for example, a high refractive index $SiO_2$ dielectric film and a low refractive index $TiO_2$ dielectric film, stacked successively on the silver reflective film may also be arranged between the light-emitting ceramic layer and the silver reflective film. The whole film layer can play a role of increasing reflection, and can also serve as the transition layer between the silver reflective film and the light-emitting ceramic layer, enhancing the bonding between a silver film and the light-emitting ceramic layer.

In some embodiments, an anti-diffusion layer is arranged between the silver reflective film and the sintering silver layer. The anti-diffusion layer may be an Ni layer, mainly to prevent diffusion of silver atoms in the silver reflective film to ensure that the silver reflective film has enough reflectivity.

In some embodiments, a substrate with bearing capability and high thermal conductivity, such as a metal or ceramic substrate, may be selected as the substrate.

In some embodiments, the substrate made from copper metal has good thermal conductivity, and the selection of the ceramic substrate such as AlN or SiC is mainly to reduce stress caused by a difference between thermal expansion coefficients of the light-emitting ceramic layer and the metal substrate during thermal expansion and cold contraction, so that the reliability of the wavelength conversion apparatus is higher. Although the ceramic substrate has thermal conductivity lower than the copper substrate and has reduced heat dissipation capability, the ceramic substrate can be applied to many high-precision light sources due to the high reliability.

The present disclosure further provides a light-emitting apparatus, including an excitation light source and the wavelength conversion apparatus described above. The light-emitting apparatus is suitable for lighting and projection fields.

In another aspect, the present disclosure further provides a method for manufacturing a wavelength conversion apparatus, including following steps:
  step 1: manufacturing a light-emitting layer, and polishing a surface of the light-emitting layer;
  step 2: forming a reflective film on the polished surface of the light-emitting layer by a physical sputtering or an evaporation process;
  step 3: coating a surface of a substrate with a silver paste that is formed by mixing silver nanoparticles and flake silver particles;
  step 4: stacking the surface of the light-emitting layer coated with the reflective film on the surface of the substrate coated with the silver paste; and
  step 5: sintering the wavelength conversion apparatus.

In some embodiments, in step 3, a content of the flake silver particles in the silver paste ranges from 2 wt % to 20 wt %, which ranges, for example, from 5 wt % to 15 wt % or from 7 wt % to 10 wt %.

In some embodiments, in step 1, the light-emitting layer manufactured is a light-emitting ceramic layer.

In some embodiments, in step 2, the reflective film formed on the polished surface of the light-emitting ceramic layer by the physical sputtering or an evaporation process is a silver reflective film. In an embodiment, prior to step 2, the method further includes forming a transition layer on the polished surface of the light-emitting ceramic layer by physical sputtering or evaporation. The transition layer may be an $Al_2O_3$ layer or a $SiO_2$ layer. In an embodiment, prior to step 2, the method further includes forming an alternating film layer of a high refractive index dielectric film and a low refractive index dielectric film, for example, a high refractive index $SiO_2$ dielectric film and a low refractive index $TiO_2$ dielectric film, stacked successively on the polished surface of the light-emitting ceramic layer by physical sputtering or evaporation. In an embodiment, subsequent to step 2, the method further includes forming an anti-diffusion layer on the silver reflective film by physical sputtering or evaporation. The anti-diffusion layer may be a metal Ni layer.

In some embodiments, in step 3, the substrate is a metal substrate or a ceramic substrate. The metal substrate may be a copper metal substrate, and the ceramic substrate may be an AlN or SiC substrate.

Compared with the related art, the present disclosure includes the following beneficial effects.

According to the wavelength conversion apparatus of the present disclosure, in order to obtain high thermal conductivity and heat dissipation capability, a sintering silver layer with extremely high thermal conductivity is used to connect the light-emitting layer and a heat dissipation substrate. The sintering silver layer is formed by mixing and sintering spherical silver nanoparticles with large-size flake silver particles and melting spherical silver nanoparticles to bond the large-size flake silver particles together. The large-size flake silver particles in the sintering silver layer manufactured ameliorate the shrinkage of the sintered silver paste, reduce sintering stress, and improve adhesive properties of the sintering silver layer. At the same time, the large-size flake silver particles in the sintering silver layer are in surface contact with each other, and the large-size flake silver particles as heat conduction channels and surface contact heat transfer therebetween can improve the thermal conductivity of the sintering silver layer.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Examples of the present disclosure are described in detail below with reference to the accompanying drawings and embodiments.

As described in BACKGROUND, at present, sintered silver is used mainly in small-size packaging in terms of device packaging, and relatively few in size areas above 4*4 mm². In terms of large-size packaging, it is difficult to volatilize an organic solvent in a middle region of sintered silver during the sintering, and silver nanoparticles easily cause an excessively large shrinkage size and relatively large stress during the sintering, which affects packaging performance (such as reduced adhesion force). At the same time, more pores are formed in the sintering silver layer, which reduces a contact area between the silver nanoparticles and reduces thermal conductivity.

In the present disclosure, by mixing and sintering silver nanoparticles and large-size flake silver particles, the sintering silver layer with excellent performance is manufactured and used as a thermal conductive bonding layer between the light-emitting layer and the substrate in the wavelength conversion apparatus, so as to obtain the wavelength conversion apparatus with high reliability and good thermal conductivity.

Figure 1:
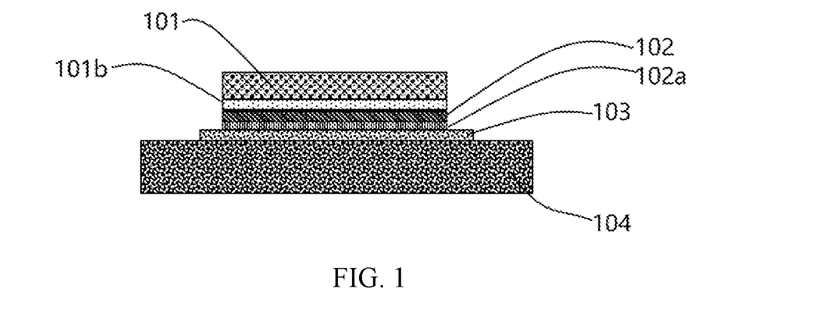
FIG. 1 is a schematic structural diagram of a wavelength conversion apparatus according to Example 1 of the present disclosure.

Referring to FIG. 1, the present disclosure provides a wavelength conversion apparatus 100, including a light-emitting layer 101, a reflective film 102, a sintering silver layer 103, and a substrate 104 stacked successively. The light-emitting layer 101 converts an excitation light into an exit light having a different wavelength from the excitation light. The reflective film 102 is plated on the light-emitting layer 101 and used for reflecting the exit light emitted by the light-emitting layer 101. The sintering silver layer 103 is connected to the light-emitting layer 101 and the substrate 104. The sintering silver layer 103 includes flake silver particles connected with each other via surface contact.

In the embodiments of the present disclosure, the light-emitting layer 101 is generally a light-emitting ceramic layer with good heat dissipation and heat resistance. Composition of a wavelength conversion material as a luminescent material is not specified, e.g., one of aluminate phosphor, halogenated phosphate phosphor, garnet phosphor, and quantum dots. For example, when YAG garnet phosphor is selected as the wavelength conversion material, the light-emitting ceramic layer 101 may be made of YAG pure-phase luminescent ceramics, or complex-phase luminescent ceramics sintered by mixing YAG with $Al_2O_3$ powder or AlN powder. In an embodiment, $Al_2O_3$ packaged YAG:Ce phosphor may be used to form the light-emitting ceramic layer. In some embodiments, when both luminous efficiency and thermal conductivity are taken into account, the light-emitting ceramic layer has a thickness of about 50 μm to 250 μm.

In an embodiment, an anti-reflection (AR) film 101a may also be arranged on an upper surface of the light-emitting layer 101 facing incident light. The AR film 101a may play a role of anti-reflection, that is, reduce reflectivity of an incident excitation light on the surface of the light-emitting layer 101, increase transmittance of the excitation light on the light-emitting layer 101, which is conducive to improving light output efficiency of the surface of the light-emitting layer 101. In an embodiment, the AR film 101a has a thickness ranging from 0.01 μm to 0.1 μm.

In the embodiments of the present disclosure, the reflective film 102 plated on the light-emitting layer 101 may be a silver reflective film, which is generally plated on a surface of the light-emitting layer 101 by using a technology such as physical sputtering or evaporation. The silver reflective film manufactured is characterized by compactness and high reflectivity. In some embodiments, the silver reflective film has a thickness ranging from 10 nm to 1 μm.

In an embodiment, in order to enhance bonding force between the light-emitting ceramic layer and the silver reflective film, the light-emitting ceramic layer may be coated first with a transition layer 101b and then with the silver reflective film. The transition layer 101b herein may be an $Al_2O_3$ layer or a $SiO_2$ layer. In addition, an alternating film layer of a high refractive index dielectric film and a low refractive index dielectric film, for example, a high refractive index $SiO_2$ dielectric film and a low refractive index $TiO_2$ dielectric film, stacked successively on the light-emitting ceramic layer may also be arranged between the light-emitting ceramic layer and the silver reflective film. The whole film layer can play a role of increasing reflection, and can also serve as the transition layer between the silver reflective film and the light-emitting ceramic layer, enhancing the bonding between the silver reflective film and the light-emitting ceramic layer. In an embodiment, the transition layer 101b has a thickness of about 10 nm to 200 nm.

In addition, in order to prevent diffusion of silver atoms in the silver reflective film and ensure that the silver reflective film has enough reflectivity, the silver reflective film may be coated with an anti-diffusion layer 102a and then connected to the sintering silver layer 103. The anti-diffusion layer 102a may be a metal Ni layer, and have a thickness of about 10 nm to 500 nm.

Figure 4:
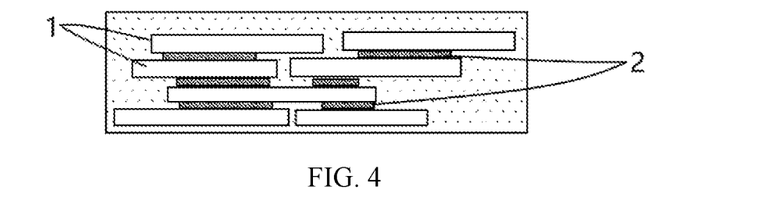
FIG. 4 is a schematic structural diagram of a sintering silver layer according to the present disclosure.

The sintering silver layer 103 of the present disclosure is manufactured by sintering spherical silver nanoparticles and large-size flake silver particles. The spherical silver nanoparticles have a similar curvature radius in all directions and are easy to melt and flow during the sintering; while the large-size flake silver particles are generally cuboid or flat, and lengths thereof in a length direction or flat direction are much longer than those in a thickness direction, which are not easy to melt during the sintering and prevent excessive shrinkage of the material. In this way, during the sintering, the large-size flake silver particles support each other and are bonded by the melted spherical silver nanoparticles to finally form the sintering silver layer 103 that includes a clamping-piece bridging structure and large-size flake silver particles in surface contact with each other. A contact area between the flake silver particles is large, and a thermal conductive network can be formed. For example, the sintering silver layer 103 may have a structure in which flake silver stacked between layers is bonded by melted silver. As shown in FIG. 4, 1 denotes the large-size flake silver particles, and 2 denotes the melted silver that acts as a link therebetween.

A raw material silver paste of the sintering silver layer is an organic silver paste that is formed by mixing the spherical silver nanoparticles and the large-size flake silver particles, which contains a small amount of organic solvent. Content of the flake silver particles in the organic silver paste ranges from 2 wt % to 20 wt %, which ranges from 5 wt % to 15 wt % in some embodiments or from 7 wt % to 10 wt % in some other embodiments. The flake silver particles have sizes above a micron level. During the sintering, the flake silver particles have smaller sintering activity than the spherical silver nanoparticles due to the large sizes. When sintered at a temperature of 150° C. to 300° C. (in some embodiments, 200° C. to 250° C.), the flake silver particles are difficult to participate in the sintering and can almost maintain their shapes. The spherical silver nanoparticles are sintered and melted to bond the flake silver particles. The content of the flake silver particles in the formed sintering silver layer is almost constant. Compared with the sintered silver layer that only contains the spherical silver nanoparticles, the introduction of the large-size flake silver particles can better solve the problem of excessively large shrinkage and relatively large stress of the spherical silver nanoparticles during the sintering, and improve the bonding properties of the sintering silver layer. At the same time, the surface contact between the flake silver particles is better than spherical point contact between the spherical silver nanoparticles, which can improve the thermal conductivity well.

As described above, in the raw material silver paste of the sintering silver layer, an addition amount of the large-size flake silver particles is a key factor for the manufactured sintering silver layer to achieve high thermal conductivity and tight bonding. When the content of the flake silver particles is less than 2 wt %, during the manufacturing of the sintering silver layer, flake silver particles with this content cannot effectively alleviate the problem of the excessively large shrinkage size of the silver nanoparticles during the sintering, and the manufactured sintering silver layer may not have an obvious effect of enhancing the thermal conductivity due to the lack of sufficient heat conduction channels. When the content of the flake silver particles is greater than 20 wt %, during the sintering, the flake silver particles do not participate in the sintering basically, and many pores may exist therebetween, resulting in poor overall density of the sintering silver layer. When the content of the flake silver particles ranges from 2 wt % to 20 wt %, which ranges from 5 wt % to 15 wt % in some embodiments or from 7 wt % to 10 wt % in some other embodiments, the introduction of the flake silver particles improves bonding properties and thermal conductivity of the sintering silver layer. In some embodiments, the sintering silver layer 103 has thermal conductivity ranging from 80 W/(m·k) to 250 W/(m·k), and a thickness ranging from 2 μm to 30 μm.

In the embodiments of the present disclosure, the substrate 104 may be a metal substrate or a ceramic substrate with high thermal stability and thermal conductivity. In the present disclosure, a copper substrate with high thermal conductivity, low costs, and good strength is a first choice. When the copper substrate is adopted, after a surface of the copper substrate is polished, an Au protective layer may be plated thereon by evaporation or sputtering to protect the surface of the copper substrate from oxidation corrosion. In some embodiments, a thickness of the Au protective layer ranges from 0.01 μm to 0.1 μm.

It is to be noted that the substrate 104 made from copper metal has good thermal conductivity, and the selection of the ceramic substrate such as AlN or SiC is mainly due to the fact that a thermal expansion coefficient of the light-emitting ceramic layer is close to that of the ceramic substrate, so that the reliability of the wavelength conversion apparatus is high. Although the ceramic substrate has thermal conductivity lower than the copper substrate and has reduced heat dissipation capability, the ceramic substrate can be applied to many high-precision light sources due to the high reliability.

The present disclosure is described in further detail below in conjunction with a manufacturing method in specific embodiments and the wavelength conversion apparatus manufactured. The following embodiments are only further descriptions of the present disclosure, and should not be understood as limitations on the present disclosure.

Example 1

As shown in FIG. 1, the wavelength conversion apparatus 100 in this Example includes a light-emitting ceramic layer 101 formed by $Al_2O_3$ packaged YAG:Ce phosphor, an $Al_2O_3$ transition layer 101b, a silver reflective film 102, an Ni anti-diffusion layer 102a, a sintering silver layer 103, and a copper substrate 104 with a gold plated surface stacked successively. A specific method for manufacturing the wavelength conversion apparatus 100 is as follows.

In step 1, a light-emitting layer is manufactured, and a surface of the light-emitting layer is polished.

$Al_2O_3$ powder, YAG:Ce phosphor particles, MgO powder additives, and $Y_2O_3$ powder additives are mixed, dried and crushed to obtain powder, the powder is loaded into a graphite mold and sintered into blocks in a spark plasma sintering furnace, and then after annealing, cutting, grinding, and polishing, the light-emitting ceramic layer 101 with a thickness of about 50 μm to 250 μm is obtained.

Ceramics machined to a certain thickness are single-side polished, polishing accuracy reaches roughness within 15 nm, and a surface looks like a mirror.

Step 2: Coating of the Light-Emitting Ceramic Layer

The light-emitting ceramic layer 101 is placed in an electron beam evaporation machine. Aluminum formed by volatilization of Al target is reacted with $O_2$ to deposit an $Al_2O_3$ transition layer 101b on the polished surface of the light-emitting ceramic layer 101 with a thickness of 10 nm to 200 nm.

Then, the sample is taken out and put into a magnetron sputtering coating machine, and a silver reflective film 102 is first plated on the $Al_2O_3$ transition layer 101b. The film layer requires uniform crystallization without abnormal stacking, and has a thickness of about 10 nm to 1 μm, which can provide good reflection performance. Then, also in the magnetron sputtering coating machine, a target head is replaced, and an Ni anti-diffusion layer 102a is plated on the silver reflective film 102. The Ni layer is not required to be excessively thick, with a thickness of about 10 nm to 500 nm, mainly to prevent diffusion of silver atoms.

The coated light-emitting ceramic layer 101 is cut into sizes of 5×5 mm² for subsequent bonding.

Step 3: Manufacturing of a Copper Substrate

A copper substrate 104 is machined into a substrate with an area of 20×20 mm² and a thickness of 3 mm. An edge of the substrate is provided with a number of screw holes for being screwed with other carriers. After being polished, a surface of the copper substrate 104 is coated, by evaporation or sputtering, with an Au layer having a thickness of about 0.01 μm to 0.1 μm.

Step 4: Sintered Bonding of the Coated Light-Emitting Ceramic Layer with the Copper Substrate A silver paste that is formed by mixing spherical silver nanoparticles and large-size flake silver particles is brushed on the copper substrate 104. The silver paste contains a small amount of organic solvent, and the content of the large-size flake silver particles is 10 wt %. After the silver paste is brushed, the light-emitting ceramic layer 101 has a coated side covering the silver paste, is pressed with a fixture, and then is heated between 150° C. and 300° C., for example, between 200° C. and 250° C. In this case, the spherical silver nanoparticles melt, but the large-size flake silver particles do not melt, and the spherical silver nanoparticles melt and bond the large-size flake silver particles together. The sintering silver layer has low stress and good bonding performance. At the same time, there are few internal holes, and the large-size flake silver particles are in surface contact with each other to form a more effective heat conduction channel, achieving good thermal conductivity. The sintering silver layer has excellent thermal conductivity of 250 W/(m·k). The sintering silver layer has a thickness of about 2 μm to 30 μm, so that the light-emitting ceramic layer 101 and the copper substrate 104 are closely bonded together to obtain the wavelength conversion apparatus 100 as shown in FIG. 1.

Example 2

Figure 2:
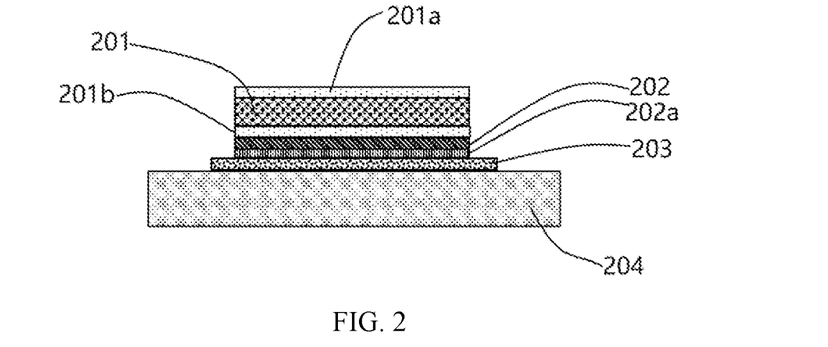
FIG. 2 is a schematic structural diagram of a wavelength conversion apparatus according to Example 2 of the present disclosure.

As shown in FIG. 2, a wavelength conversion apparatus 200 in this Example is similar to the wavelength conversion apparatus 100 in Example 1, and includes an AR film 201a, a light-emitting ceramic layer 201, an $Al_2O_3$ transition layer 201b, a silver reflective film 202, an Ni anti-diffusion layer 202a, a sintering silver layer 203, and an AlN ceramic substrate 204 stacked successively. A specific method for manufacturing the wavelength conversion apparatus 200 is as follows.

In step 1, a light-emitting layer is manufactured, and the light-emitting layer is double-side polished.

$Al_2O_3$ powder, YAG:Ce phosphor particles, MgO powder additives, and $Y_2O_3$ powder additives are mixed, dried and crushed to obtain powder, the powder is loaded into a graphite mold and sintered into blocks in a spark plasma sintering furnace, and then after annealing, cutting, grinding, and polishing, the light-emitting ceramic layer 201 with a thickness of about 50 μm to 250 μm is obtained.

Ceramics machined to a certain thickness are double-side polished, polishing accuracy reaches roughness within 15 nm, and a surface looks like a mirror.

Step 2: Coating of the Light-Emitting Ceramic Layer

The light-emitting ceramic layer 201 is placed in an electron beam evaporation machine. After volatilization by Al target and reaction with $O_2$, an $Al_2O_3$ transition layer 201b is deposited on the polished surface of the light-emitting ceramic layer 201 with a thickness of 10 nm to 200 nm.

Then, the sample is taken out and put into a magnetron sputtering coating machine, and a silver reflective film 202 is first plated on the $Al_2O_3$ transition layer 201b. The film layer requires uniform crystallization without abnormal stacking, and has a thickness of about 10 nm to 1 μm, which can provide good reflection performance. Then, also in the magnetron sputtering coating machine, a target head is replaced, and an Ni anti-diffusion layer 202a is plated on the silver reflective film 202. The Ni layer is not required to be excessively thick, with a thickness of about 10 nm to 500 nm, mainly to prevent diffusion of silver atoms.

Next, the other polished surface of the light-emitting ceramic layer 201 (an upper surface of the light-emitting ceramic layer 201 in this Example) is coated with an AR film 201 with a thickness of about 0.01 μm to 0.1 μm, to improve light output efficiency.

The coated light-emitting ceramic layer 201 is cut into sizes of 5×5 mm² for subsequent bonding.

Step 3: Manufacturing of a Ceramic Substrate

An AlN ceramic substrate with high thermal conductivity greater than 100 W/(m·k) is selected. In other Examples, a SiC ceramic substrate may also be selected.

The AlN ceramic substrate is machined into a substrate with an area of 10×10 mm² and a thickness of 1 mm to 3 mm. After a surface is polished, a copper layer is made on the surface by a copper coating process, and then an Au layer is plated thereon by evaporation or sputtering, with a thickness of about 0.01 μm to 0.1 μm.

Step 4: Sintered Bonding of the Coated Light-Emitting Ceramic Layer with the Ceramic Substrate A silver paste that is formed by mixing spherical silver nanoparticles and large-size flake silver particles is brushed on the AlN ceramic substrate 204. The silver paste contains a small amount of organic solvent, and the content of the large-size flake silver particles is in a range of 2 wt % to 20 wt %. After the silver paste is brushed, the light-emitting ceramic layer 201 has a side coated with the silver reflective film 202 covering the silver paste, is pressed with a fixture, and then is heated between 150° C. and 300° C., for example, between 200° C. and 250° C. In this case, the spherical silver nanoparticles melt, but the large-size flake silver particles do not melt, and the spherical silver nanoparticles melt and fuse the large-size flake silver particles together. The sintering silver layer 203 has low stress and good bonding performance. At the same time, there are few internal holes, and the large-size flake silver particles are in surface contact with each other to form an effective heat conduction channel, brining good thermal conductivity. The sintering silver layer 203 has excellent thermal conductivity in a range of 80 W/(m·k) to 250 W/(m·k). The sintering silver layer 203 has a thickness of about 2 μm to 30 μm, so that the light-emitting ceramic layer 201 and the AlN ceramic substrate 204 are closely bonded together to obtain the wavelength conversion apparatus 200 as shown in FIG. 2.

Compared with Example 1, the copper substrate is replaced with the AlN ceramic substrate in Example 2. Although the AlN ceramic substrate has thermal conductivity lower than the copper substrate and has reduced heat dissipation capability, a thermal expansion coefficient of the AlN ceramic substrate is close to that of the light-emitting ceramic layer. The obtained wavelength conversion device 200 has high reliability and can be applied to many high-precision light sources.

Example 3

Figure 3:
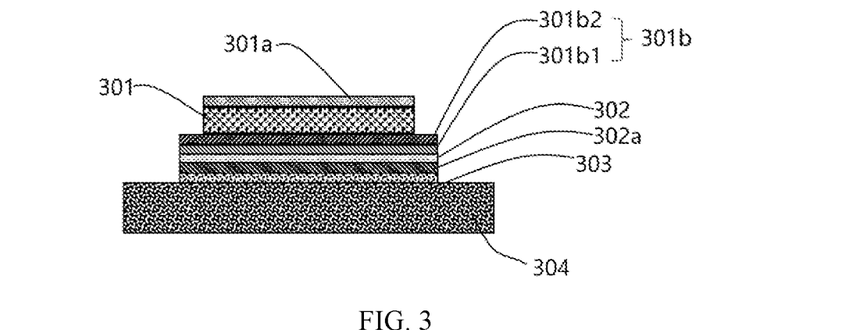
FIG. 3 is a schematic structural diagram of a wavelength conversion apparatus according to Example 3 of the present disclosure.

As shown in FIG. 3, a wavelength conversion apparatus 300 in this Example is similar to the wavelength conversion apparatus 100 in Example 1, and includes an AR film 301a, a light-emitting ceramic layer 301, an alternating high and low refractive index coated dielectric layer 301b, a silver reflective film 302, an Ni anti-diffusion layer 302a, a sintering silver layer 303, and a copper substrate 304 with a gold plated surface stacked successively. For example, a method for manufacturing the wavelength conversion apparatus 300 is as follows.

In step 1, a light-emitting layer is manufactured, and the light-emitting layer is double-side polished.

$Al_2O_3$ powder, YAG:Ce phosphor particles, MgO powder additives, and $Y_2O_3$ powder additives are mixed, dried and crushed to obtain powder, the powder is loaded into a graphite mold and sintered into blocks in a spark plasma sintering furnace, and then after annealing, cutting, grinding, and polishing, the light-emitting ceramic layer 301 with a thickness of about 50 μm to 250 μm is obtained.

Ceramics machined to a certain thickness are double-side polished, polishing accuracy reaches roughness within 15 nm, and a surface looks like a mirror.

Step 2: Coating of the Light-Emitting Ceramic Layer

The light-emitting ceramic layer 301 is placed in an electron beam evaporation machine, and a polished surface of the light-emitting ceramic layer 301 is alternately coated. Alternating film layers are a low refractive index dielectric film 301b2 and a high refractive index dielectric film 301b1. The low refractive index dielectric film and the high refractive index dielectric film are $TiO_2$ and $SiO_2$ respectively. The alternating dielectric film may have 2 layers or dozens of layers, which is 2 layers in Example 3, and the overall thickness is about 10 nm to 200 nm. The alternating high and low refractive index coated dielectric layer 301b may increase the reflection, and may also enhance the bonding of the silver reflective film 302 with the light-emitting ceramic layer 301.

Then, the sample mentioned above is taken out and put into a magnetron sputtering coating machine, and a silver reflective film 302 is first plated on the alternating high and low refractive index coated dielectric layer 301b. The film layer requires uniform crystallization without abnormal stacking, and has a thickness of about 10 nm to 1 μm, which can provide good reflection performance. Then, also in the magnetron sputtering coating machine, a target head is replaced, and an Ni anti-diffusion layer 302a is plated on the silver reflective film 302. The Ni layer is not required to be excessively thick, with a thickness of about 10 nm to 500 nm, mainly to prevent diffusion of silver atoms.

Next, the other polished surface of the light-emitting ceramic layer 301 (an upper surface of the light-emitting ceramic layer 301 in this Example) is coated with an AR film 301a with a thickness of about 0.01 μm to 0.1 μm, to improve light output efficiency.

The coated light-emitting ceramic layer 301 is cut into sizes of 5×5 mm² for subsequent bonding.

Step 3: Manufacturing of a Copper Substrate

A copper substrate 304 is machined into a substrate with an area of 20×20 mm² and a thickness of 3 mm. An edge of the substrate is provided with a number of screw holes for being screwed with other carriers. After being polished, a surface of the copper substrate 304 is coated, by evaporation or sputtering, with an Au layer having a thickness of about 0.01 μm to 0.5 μm.

Step 4: Bonding of the Light-Emitting Ceramic Layer with the Copper Substrate

A silver paste that is formed by mixing spherical silver nanoparticles and large-size flake silver particles is brushed on the copper substrate 304. The silver paste contains a small amount of organic solvent, and the content of the large-size flake silver particles is in a range of 2 wt % to 20 wt %. After the silver paste is brushed, the light-emitting ceramic layer 301 has a side coated with the silver reflective film 302 covering the silver paste, is pressed with a fixture, and then is heated between 150° C. and 300° C., for example, between 200° C. and 250° C. In this case, the spherical silver nanoparticles melt, but the large-size flake silver particles do not melt, and the spherical silver nanoparticles melt and fuse the large-size flake silver particles together. The sintering silver layer 303 has low stress and good bonding performance. At the same time, there are fewer internal holes, and the large-size flake silver particles are in surface contact with each other to form a more effective heat conduction channel, brining good thermal conductivity. The sintering silver layer 303 has excellent thermal conductivity in a range of 80 W/(m·k) to 250 W/(m·k). The sintering silver layer 303 has a thickness of about 2 μm to 30 μm, so that the light-emitting ceramic layer 301 and the copper substrate 304 are closely bonded together to obtain the wavelength conversion apparatus 300 as shown in FIG. 3.

Example 4

In this Example, except that the content of the large-size flake silver particles in the paste of the sintering silver layer is 7 wt % in step 4, the remaining steps are the same as those in Example 1. The sintering silver layer manufactured has thermal conductivity of 220 W/(m·k).

Example 5

In this Example, except that the content of the large-size flake silver particles in the paste of the sintering silver layer is 15 wt % in step 4, the remaining steps are the same as those in Example 1. The sintering silver layer manufactured has thermal conductivity of 200 W/(m·k).

Example 6

In this Example, except that the content of the large-size flake silver particles in the paste of the sintering silver layer is 5 wt % in step 4, the remaining steps are the same as those in Example 1. The sintering silver layer manufactured has thermal conductivity of 150 W/(m·k).

Example 7

In this Example, except that the content of the large-size flake silver particles in the paste of the sintering silver layer is 1 wt % in step 4, the remaining steps are the same as those in Example 1. During the sintering, an area of the paste of the silver layer shrinks obviously. The sintering silver layer manufactured has thermal conductivity less than 80 W/(m·k).

Example 8

In this Example, when the content of the large-size flake silver particles in the paste of the sintering silver layer is 22 wt %, during the sintering, the large-size flake silver particles have gaps therebetween and poor overall density, and the sintering silver layer manufactured cannot be effectively bonded to the light-emitting layer and the substrate.

An Example of the present disclosure further provides a light-emitting apparatus. The light-emitting apparatus includes an excitation light source and a wavelength conversion apparatus. The wavelength conversion apparatus may have the structures and the functions in the above Examples. The light-emitting apparatus may be applied to projection systems, such as liquid crystal displays (LCD) or digital light processor (DLP) projectors; or applied to lighting systems, such as car lights or stage lights; or applied to the field of 3D display technologies.

Various Examples in the specification are described progressively. Each Example focuses on differences from other Examples, and same and similar parts among the Examples may be referred to each other.

The above are only Examples of the present disclosure and not thus intended to limit the protection scope of the present disclosure. All equivalent structures or equivalent flow modifications made by virtue of contents of the specification and the drawings of the present disclosure or direct or indirect application of the contents to the other related technical fields shall fall within the protection scope of the present disclosure.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A wavelength conversion apparatus, comprising a light-emitting layer, a reflective film, a silver layer, and a substrate stacked successively;
wherein the light-emitting layer is configured to convert an excitation light into exit light having a different wavelength from the excitation light, and the reflective film is plated on the light-emitting layer and configured to reflect the exit light emitted from the light-emitting layer; and the light-emitting layer and the substrate are connected by the silver layer, and the silver layer has a clamping-piece bridging structure in which large-size flake silver particles are in surface contact with one another and melted silver is configured to bond the large-size flake silver particles.

2. The wavelength conversion apparatus according to claim 1, wherein a thermal conductivity of the silver layer ranges from 80 W/(m·k) to 250 W/(m·k).

3. The wavelength conversion apparatus according to claim 1, wherein the silver layer comprises a structure in which flake silver stacked between layers is bonded by the melted silver.

4. The wavelength conversion apparatus according to claim 1, wherein the light-emitting layer is a light-emitting ceramic layer.

5. The wavelength conversion apparatus according to claim 4, wherein the reflective film is a silver reflective film.

6. The wavelength conversion apparatus according to claim 5, wherein a transition layer is arranged between the light-emitting ceramic layer and the silver reflective film.

7. The wavelength conversion apparatus according to claim 6, wherein the transition layer is an $Al_2O_3$ layer or a $SiO_2$ layer.

8. The wavelength conversion apparatus according to claim 6, wherein an alternating film layer of a high refractive index dielectric film and a low refractive index dielectric film stacked successively on the silver reflective film is arranged between the light-emitting ceramic layer and the silver reflective film.

9. The wavelength conversion apparatus according to claim 5, wherein an anti-diffusion layer is arranged between the silver reflective film and the silver layer.

10. The wavelength conversion apparatus according to claim 1, wherein the substrate is a metal substrate or a ceramic substrate.

11. A light-emitting apparatus, comprising an excitation light source and a wavelength conversion apparatus,
wherein the wavelength conversion apparatus comprises a light-emitting layer, a reflective film, a silver layer, and a substrate stacked successively; and
wherein the light-emitting layer is configured to convert an excitation light into exit light having a different wavelength from the excitation light, and the reflective film is plated on the light-emitting layer and configured to reflect the exit light emitted from the light-emitting layer; and the light-emitting layer and the substrate are connected by the silver layer, and the silver layer has a clamping-piece bridging structure in which large-size flake silver particles are in surface contact with one another and melted silver is configured to bond the large-size flake silver particles.

12. A method for manufacturing a wavelength conversion apparatus, comprising following steps:
manufacturing a light-emitting layer, and polishing a surface of the light-emitting layer;
forming a reflective film on the polished surface of the light-emitting layer by a physical sputtering or an evaporation process;
coating a surface of a substrate with a silver paste mixed with silver nanoparticles and flake silver particles;
stacking the surface of the light-emitting layer coated with the reflective film on the surface of the substrate coated with the silver paste; and
sintering the wavelength conversion apparatus so that the silver nanoparticles melt and bind the flake silver particles together to form a silver layer, and the silver layer is connected to the light-emitting layer and the substrate, the silver layer has a clamping-piece bridging structure in which large-size flake silver particles are in surface contact with one another and melted silver is configured to bond the large-size flake silver particles.

13. The method for manufacturing the wavelength conversion apparatus according to claim 12, wherein, in the step of coating a surface of a substrate with a silver paste mixed with silver nanoparticles and flake silver particles, a content of the flake silver particles in the silver paste ranges from 2 wt % to 20 wt %.

14. The method for manufacturing the wavelength conversion apparatus according to claim 12, wherein the manufacturing the light-emitting layer comprises: mixing a ceramic matrix with light-emitting material powder, and then pressing and sintering the mixed powder to obtain a light-emitting ceramic layer.

15. The method for manufacturing the wavelength conversion apparatus according to claim 14, wherein in the step of forming a reflective film on the polished surface of the light-emitting layer by a physical sputtering or an evaporation process, the reflective film formed on the polished surface of the light-emitting ceramic layer by the physical sputtering or an evaporation process is a silver reflective film.

16. The method for manufacturing the wavelength conversion apparatus according to claim 15, prior to the step of forming a reflective film on the polished surface of the light-emitting layer by a physical sputtering or an evaporation process, further comprising: forming a transition layer on the polished surface of the light-emitting ceramic layer by physical sputtering or evaporation.

17. The method for manufacturing the wavelength conversion apparatus according to claim 16, wherein the transition layer is an $Al_2O_3$ layer or a $SiO_2$ layer.

18. The method for manufacturing the wavelength conversion apparatus according to claim 15, prior to the step of forming a reflective film on the polished surface of the light-emitting layer by a physical sputtering or an evaporation process, further comprising forming an alternating film layer of a high refractive index dielectric film and a low refractive index dielectric film on the polished surface of the light-emitting ceramic layer by physical sputtering or evaporation.

19. The method for manufacturing the wavelength conversion apparatus according to claim 15, subsequent to the step of forming a reflective film on the polished surface of the light-emitting layer by a physical sputtering or an evaporation process, further comprising forming an anti-diffusion layer on the silver reflective film by physical sputtering or evaporation.

20. The method for manufacturing the wavelength conversion apparatus according to claim 12, wherein, in the step of coating a surface of a substrate with a silver paste mixed with silver nanoparticles and flake silver particles, the substrate is a metal substrate or a ceramic substrate.

\* \* \* \* \*